(12) United States Patent
Ritter et al.

(10) Patent No.: US 11,799,494 B2
(45) Date of Patent: Oct. 24, 2023

(54) DELTA-SIGMA MODULATOR, DELTA-SIGMA DIGITAL-ANALOG CONVERTER, AND METHOD FOR OPERATING A DELTA-SIGMA MODULATOR AND A DELTA-SIGMA DIGITAL-ANALOG CONVERTER

(71) Applicant: Robert Bosch GmbH, Stuttgart (DE)

(72) Inventors: Rudolf Ritter, Esslingen (DE); Andreas Schmidt, Plochingen (DE); Thorsten Balslink, Kirchentellinsfurt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 99 days.

(21) Appl. No.: 17/581,529

(22) Filed: Jan. 21, 2022

(65) Prior Publication Data

US 2022/0247426 A1    Aug. 4, 2022

(30) Foreign Application Priority Data

Feb. 1, 2021  (DE) ............ 10 2021 200 904.2

(51) Int. Cl.
*H03M 3/00* (2006.01)
*H03M 1/12* (2006.01)

(52) U.S. Cl.
CPC ............ *H03M 3/422* (2013.01); *H03M 3/50* (2013.01); *H03M 1/12* (2013.01); *H03M 3/32* (2013.01)

(58) Field of Classification Search
CPC .......... H03M 3/422; H03M 3/50; H03M 3/00; H03M 3/32; H03M 1/12
See application file for complete search history.

(56) References Cited

U.S. PATENT DOCUMENTS

| | | | |
|---|---|---|---|
| 8,760,330 B2 | 6/2014 | Ritter et al. | |
| 8,896,471 B1 | 11/2014 | Pagnanelli | |
| 2005/0237233 A1* | 10/2005 | Muhammad | H03M 3/396 341/143 |

FOREIGN PATENT DOCUMENTS

DE    102017214765 A1    3/2018

* cited by examiner

*Primary Examiner* — Joseph J Lauture
(74) *Attorney, Agent, or Firm* — NORTON ROSE FULBRIGHT US LLP; Gerard Messina

(57) ABSTRACT

A delta-sigma modulator which receives an input signal. The input signal is combined with a feedback signal and the combined signal is filtered by the delta-sigma modulator. The filtered signal is quantized, wherein the feedback signal is generated on the basis of the quantized signal. The quantized signal is output as an output signal. The input signal and/or the filtered signal and/or the feedback signal are filtered in such a way that at least one frequency in an out-of-band frequency range of the input signal is amplified in order to suppress out-of-band quantization noise at the at least one frequency.

10 Claims, 3 Drawing Sheets

DELTA-SIGMA MODULATOR, DELTA-SIGMA DIGITAL-ANALOG CONVERTER, AND METHOD FOR OPERATING A DELTA-SIGMA MODULATOR AND A DELTA-SIGMA DIGITAL-ANALOG CONVERTER

FIELD

The present invention relates to a delta-sigma modulator, a delta-sigma digital-analog converter, a method for operating a delta-sigma modulator, and a method for operating a delta-sigma digital-analog converter.

BACKGROUND INFORMATION

A delta-sigma digital-analog converter comprises a delta-sigma modulator, which based on an input signal generates a quantized signal, i.e., a bitstream. The bitstream is subsequently filtered by a lowpass filter. The sampling frequency here is many times higher than the bandwidth of the input signal, i.e. oversampling takes place.

The quantization gives rise to relatively large quantization errors. By using a control loop it is possible to achieve a decreased quantization error in a selected frequency band, namely the in-band frequency range of the input signal. Since, however, the power of the quantization error cannot be decreased, it is increased at other frequencies, namely in the out-of-band (OOB) frequency range. The effect of this error is comparable to that of noise, therefore it is also referred to as quantization noise.

In consequence of the noise generation just described, the contribution of the quantization noise can be significantly decreased by the subsequent lowpass filtering.

A delta-sigma analog-digital converter which is configured to reduce certain spurious contributions is described in U.S. Pat. No. 8,760,330 B2.

However, the residual quantization noise in the out-of-band frequency range can also be disadvantageous. Thus in a number of applications, the quantization noise at dedicated frequencies in the out-of-band frequency range can adversely impact the system's properties. It is precisely at these frequencies, and for this reason, that a decrease in the quantization noise is desirable.

SUMMARY

The present invention provides a delta-sigma modulator, a delta-sigma digital-analog converter, a method for operating a delta-sigma modulator, and a method for operating a delta-sigma digital-analog converter.

Preferred specific embodiments of the present invention are disclosed herein.

According to a first aspect, the present invention relates to a delta-sigma modulator having an input interface which is configured to receive an input signal, wherein the input signal includes frequency components in an in-band frequency range and frequency components in an out-of-band frequency range. In accordance with an example embodiment of the present invention, the delta-sigma modulator further comprises a first filter device which is configured to combine the input signal with a feedback signal, to filter it, and to output it as a filtered signal. The delta-sigma modulator comprises a quantizer which is configured to quantize the filtered signal and to output it as a quantized signal, wherein on the basis of the quantized signal the feedback signal is generated and fed to the first filter device. There is further provided an output interface which is configured to output the quantized signal as an output signal. The delta-sigma modulator comprises a second filter device which is configured to filter the input signal and/or the filtered signal and/or the feedback signal in such a way that at least one frequency in the out-of-band frequency range of the input signal is amplified, in order to suppress out-of-band quantization noise at the at least one frequency.

According to a second aspect, the present invention relates to a delta-sigma digital-analog converter having a delta-sigma modulator according to the present invention, wherein the input signal of the delta-sigma modulator is a digital signal and wherein the output signal of the delta-sigma modulator is a digital bitstream. The delta-sigma digital-analog converter further comprises a digital-analog converter which is configured to convert the output signal to an analog signal and to output it.

According to a third aspect, the present invention relates to a method for operating a delta-sigma modulator. In accordance with an example embodiment of the present invention, the delta-sigma modulator receives an input signal, wherein the input signal includes frequency components in an in-band frequency range and frequency components in an out-of-band frequency range. The input signal is combined with a feedback signal and the combined signal is filtered by the delta-sigma modulator. The filtered signal is quantized, wherein the feedback signal is generated on the basis of the quantized signal. The quantized signal is output as an output signal. The input signal and/or the filtered signal and/or the feedback signal are filtered in such a way that at least one frequency in the out-of-band frequency range of the input signal is amplified in order to suppress out-of-band quantization noise at the at least one frequency.

According to a fourth aspect, the present invention relates to a method for operating a delta-sigma digital-analog converter, wherein the delta-sigma digital-analog converter includes a delta-sigma modulator. In accordance with an example embodiment of the present invention, first, on the basis of an input signal, an output signal is generated via the method according to the present invention for operating the delta-sigma modulator, wherein the input signal of the delta-sigma modulator is a digital signal, and wherein the output signal of the delta-sigma modulator is a digital bitstream. The output signal is converted to an analog signal and the analog signal is output.

Out-of-band quantization noise reduction is possible only under certain conditions when using conventional methods, e.g., optimization of the existing control filters. The delta-sigma modulator according to the present invention, however, is able to suppress the out-of-band quantization noise strongly at certain frequencies through specific amplification of frequencies in the out-of-band frequency range of the input signal. Thus the delta-sigma modulator does not serve for suppressing the in-band quantization noise, which represents the classical application of delta-sigma digital-analog converters, or for suppressing spurious signals, but for suppressing the out-of-band quantization noise.

The suppression of the out-of-band quantization noise results from the amplification of the at least one frequency in the out-of-band frequency range of the input signal. The reason is that in a stable system, amplification of the control path leads to suppression in the closed control loop.

According to a development of the delta-sigma modulator of the present invention, the second filter device includes at least one resonator which is configured to amplify the at least one frequency in the out-of-band frequency range of the input signal. Out-of-band quantization noise may thereby be specifically suppressed at certain frequencies.

According to a development of the delta-sigma modulator of the present invention, the second filter device is arranged at least in part in a feedback loop of the delta-sigma modulator, and is configured to filter the feedback signal before the feedback to the first filter device. The filtering may consequently take place within the feedback loop.

According to a development of the delta-sigma modulator of the present invention, the second filter device is integrated at least in part into the first filter device. In particular, it is possible to provide that the first filter device and the second filter device are implemented as a single component.

According to a development of the delta-sigma modulator of the present invention, the quantizer is a multi-bit quantizer.

According to a development of the delta-sigma digital-analog converter of the present invention, the delta-sigma digital-analog converter comprises a filter which is configured to filter the analog signal in order to filter out at least in part frequency components in the out-of-band frequency range.

According to a development of the delta-sigma digital-analog converter of the present invention, the delta-sigma digital-analog converter exhibits maximum suppression of quantization noise for at least one frequency in the in-band frequency range of the input signal, wherein the second filter device is configured to amplify at least one frequency in the out-of-band frequency range of the input signal which is a multiple of the at least one frequency in the in-band frequency range. The system superordinate to the delta-sigma digital-analog converter typically exhibits through non-linearities a noise susceptibility exactly at multiples of the in-band frequencies at which maximum suppression occurs. It is possible to suppress the quantization noise at these frequencies by connecting additional controllers, whereby the superordinate system is no longer impaired and the robustness of the system is enhanced.

According to a development of the method for operating the delta-sigma modulator according to the present invention, at least one frequency in the out-of-band frequency range of the input signal is amplified using a resonator.

According to a development of the method for operating the delta-sigma digital-analog converter of the present invention, the analog signal is filtered in order to filter out at least in part frequency components in the out-of-band frequency range.

According to a development of the method for operating the delta-sigma digital-analog converter of the present invention, maximum suppression of quantization noise takes place for at least one frequency in the in-band frequency range of the input signal when operating the delta-sigma digital-analog converter, wherein at least one frequency in the out-of-band frequency range of the input signal is amplified which is a multiple of the at least one frequency in the in-band frequency range.

DETAILED DESCRIPTION OF EXAMPLE EMBODIMENTS

Figure 1:
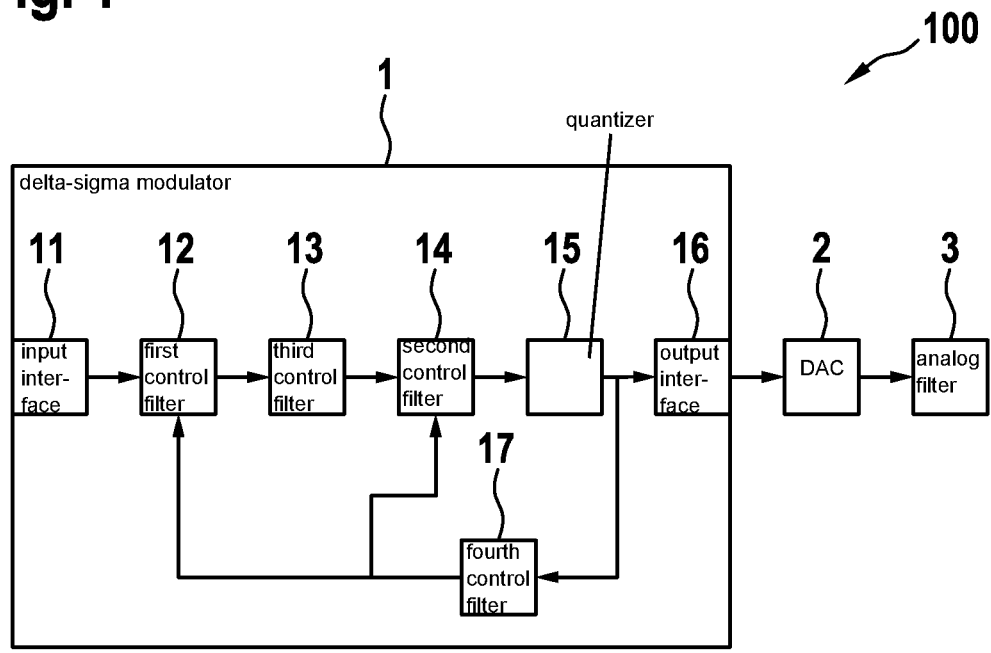
FIG. 1 shows a schematic block diagram of a delta-sigma digital-analog converter having a delta-sigma modulator according to a specific embodiment of the present invention.

FIG. 1 shows a schematic block diagram of a delta-sigma digital-analog converter 100 having a delta-sigma modulator 1. The delta-sigma modulator 1 comprises an input interface 11 which receives an input signal. The input signal may be a measurement signal of a sensor, for instance an acoustic signal, a radar signal, or the like. The input signal includes frequency components in a useful band and/or in-band frequency range respectively, and frequency components in an out-of-band frequency range.

The delta-sigma modulator 1 further comprises a filter device which combines the input signal with a feedback signal, filters it, and outputs it as a filtered signal. In the depicted specific embodiment, the first filter device comprises a first control filter 12 and a second control filter 14, which for example may each respectively be configured as an integrator or resonator having a resonant frequency in the in-band frequency range.

The delta-sigma modulator 1 further comprises a quantizer 15, which quantizes the filtered signal and outputs it as a quantized signal. On the basis of the quantized signal, the feedback signal is generated which is fed to the first filter device via a feedback loop.

Further there is provided an output interface 16 which outputs the quantized signal as an output signal.

The delta-sigma modulator 1 further comprises a second filter device which filters one or several out of the group consisting of the input signal, the filtered signal, and the feedback signal in such a way that at least one frequency in the out-of-band frequency range of the input signal is amplified in order to suppress out-of-band quantization noise at the at least one frequency.

The second filter device may for example include a third control filter 13 and a fourth control filter 17. The third control filter 13 receives the output signal of the first control filter 12, filters it, and feeds the filtered output signal to the second control filter 14. The fourth control filter 17 receives the signal quantized by the quantizer 15, filters it, and feeds the filtered quantized signal as a feedback signal to the first control filter 12 and to the second control filter 14.

The third control filter 13 and/or the fourth control filter 17 may for example be resonators which specifically suppress a predefined frequency.

In the depicted specific embodiment, the second filter device consequently comprises the third control filter 13, which is installed between the first control filter 12 and the second control filter 14 of the first filter device. According to further specific embodiments, the third control filter 13 may also be part of the first filter device.

In the depicted specific embodiment, the second filter device further comprises the fourth control filter 14, which is arranged in the feedback loop and filters the feedback signal before the feedback to the first filter device.

The first and the second filter device are configured in such a way that maximum suppression of the quantization noise takes place for at least one frequency in the in-band frequency range of the input signal. The second filter device amplifies at least one frequency in the out-of-band frequency range of the input signal which is a multiple of the at least one frequency in the in-band frequency range. For example, at least one frequency in the in-band frequency range may be predefined by a user on the basis of the desired signal properties. Harmonics, i.e., multiples of the predefined frequencies which are present in the out-of-band frequency range, are specifically suppressed by appropriately chosen control filters 13, 17 of the second filter device.

The depicted specific embodiment should be understood as merely an example. Thus, the present invention is not limited to a particular number of control filters 12, 13, 14, 17.

Furthermore, one or several of the control filters may also be absent. For instance, it may be possible for only the third control filter 13 or only the fourth control filter 17 to be provided in the feedback loop. The first filter device may comprise an arbitrary plurality of filters.

For the delta-sigma digital-analog converter 100 shown in FIG. 1, the input signal of the delta-sigma modulator 1 is a digital signal. The output signal output by the delta-sigma modulator 1 is a digital bitstream.

The delta-sigma digital-analog converter 100 further comprises a digital-analog converter 2, which converts the output signal to an analog signal and outputs it. The digital-analog converter 2 is, for example, an n-bit digital-analog converter which converts an n-bit digital data word from digital to analog, and wherein n is a natural number greater than 1. The quantizer 15 accordingly reduces the digital word length to the required n bits. The control filters 12, 13, 14, 17, and the quantizer 15 form a control loop.

The delta-sigma digital-analog converter 100 further comprises optionally an analog filter 3, which filters the analog signal in order to filter out at least in part frequency components in the out-of-band frequency range.

Figure 2:
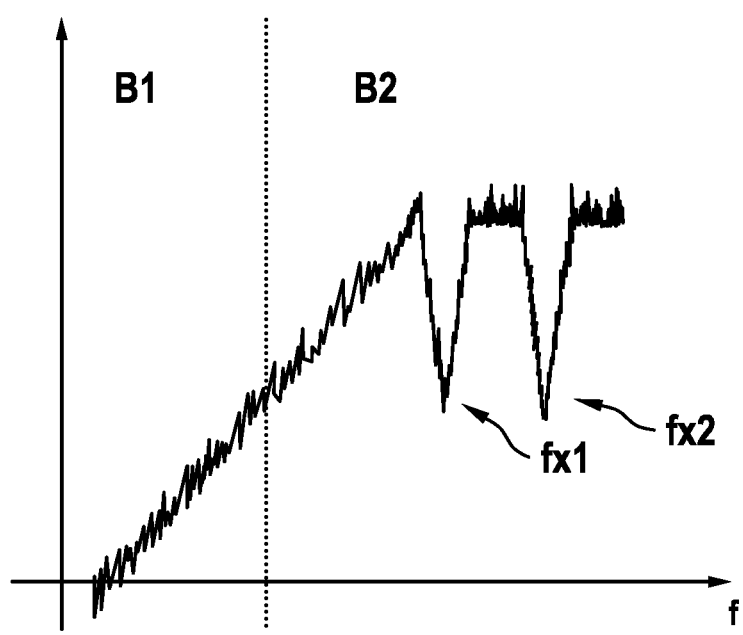
FIG. 2 shows an example spectrum of quantization noise with suppression of frequencies in the out-of-band frequency range.

FIG. 2 shows an example spectrum of quantization noise having an in-band frequency range B1 and an out-of-band frequency range B2, having suppression of frequencies fx1 and fx2 in the out-of-band frequency range B2. The suppression results from additional controllers, which exhibit amplification at the frequencies fx1 and fx2. This may happen e.g. by using resonators. The depicted spectrum then exhibits, as desired, low quantization noise at the frequencies fx1 and fx2.

Figure 3:
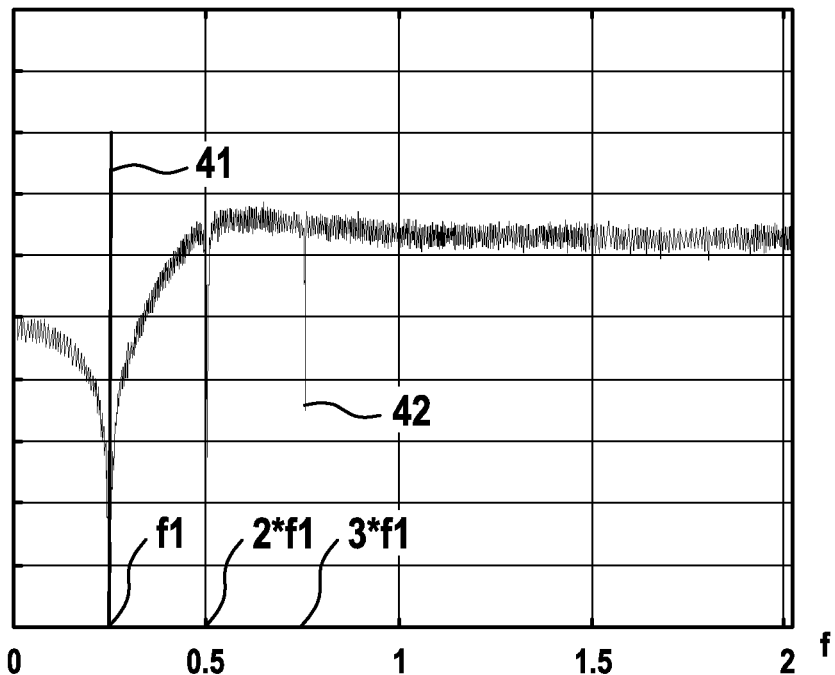
FIG. 3 shows an example spectra of quantization noise with and without suppression of frequencies in the out-of-band frequency range.

FIG. 3 shows example spectra of a quantization noise with and without suppression of frequencies in the out-of-band frequency range. The delta-sigma digital-analog converter 100 exhibits especially high suppression of the quantization noise at a predefined frequency f1. Such a delta-sigma digital-analog converter 100 is also referred to as a bandpass delta-sigma digital-analog converter. A first spectrum 41 without suppression exhibits high contributions at all frequencies in the out-of-band range. A second spectrum 42 with suppression exhibits local minima at multiples of the frequency f1 (i.e. 2·f1, 3b×f1 in the depicted example), which arise from the suppression.

Figure 4:
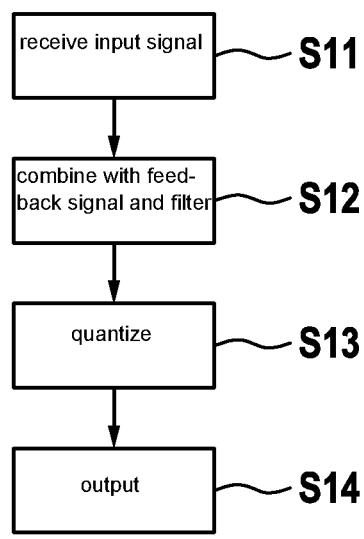
FIG. 4 shows a flowchart of a method for operating a delta-sigma modulator according to a specific embodiment of the present invention.

FIG. 4 shows a flowchart of a method for operating a delta-sigma modulator 1 according to the present invention.

In a first method step S11, the delta-sigma modulator 1 receives an input signal, wherein the input signal includes frequency components in an in-band frequency range and frequency components in an out-of-band frequency range. When used in a delta-sigma digital-analog converter 100, the input signal is a digital signal.

In a second method step S12, the input signal is combined with a feedback signal and the combined signal is filtered by the delta-sigma modulator 1.

The filtered signal is quantized in a further step S13, wherein the feedback signal is generated on the basis of the quantized signal. The input signal and/or the filtered signal and/or the feedback signal are filtered in such a way that at least one frequency in the out-of-band frequency range of the input signal is amplified, in order to suppress an out-of-band quantization noise at the at least one frequency.

In a fourth step S14, the quantized signal is output as an output signal.

Figure 5:
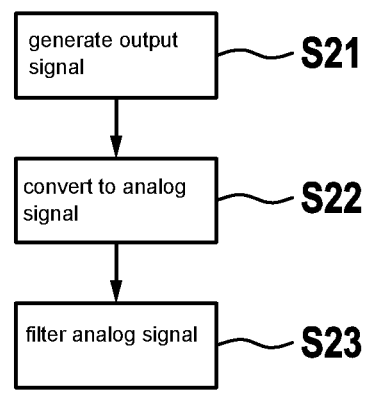
FIG. 5 shows a flowchart of a method for operating a delta-sigma digital-analog converter according to a specific embodiment of the present invention.

FIG. 5 shows a flowchart of a method for operating a delta-sigma digital-analog converter 100, wherein the delta-sigma digital-analog converter 100 includes a delta-sigma modulator 1 according to the present invention.

To begin with, an output signal is generated in a first method step S21 on the basis of an input signal, using the method for operating the delta-sigma modulator 1 described in connection with FIG. 4, wherein the input signal of the delta-sigma modulator 1 is a digital signal, and wherein the output signal of the delta-sigma modulator 1 is a digital bitstream.

The output signal is converted to an analog signal in a method step S22 and the analog signal is output.

In an optional further method step S23, the analog signal is filtered in order to filter out at least in part frequency components in the out-of-band frequency range.

The invention claimed is:

1. A delta-sigma modulator, comprising:
an input interface configured to receive an input signal, wherein the input signal includes frequency components in an in-band frequency range and frequency components in an out-of-band frequency range;
a first filter device configured to combine the input signal with a feedback signal, to filter the combined signal, and to output the filtered combined signal as a filtered signal;
a quantizer configured to quantize the filtered signal and to output it as a quantized signal, wherein the feedback signal is generated based on the quantized signal and is fed back to the first filter device;
an output interface configured to output the quantized signal as an output signal; and
a second filter device configured to filter at least one of the input signal, the filtered signal, and the feedback signal in such a way that at least one frequency in the out-of-band frequency range of the input signal is amplified to suppress out-of-band quantization noise at the at least one frequency.

2. The delta-sigma modulator according to claim 1, wherein the second filter device includes at least one resonator which is configured to amplify the at least one frequency in the out-of-band frequency range of the input signal.

3. The delta-sigma modulator according to claim 1, wherein the second filter device is arranged at least in part in a feedback loop and is configured to filter the feedback signal before the feedback to the first filter device.

4. The delta-sigma modulator according to claim 1, wherein the second filter device is integrated at least in part in the first filter device.

5. A delta-sigma digital-analog converter, comprising:
a delta-sigma modulator including:
an input interface configured to receive an input signal, wherein the input signal includes frequency components in an in-band frequency range and frequency components in an out-of-band frequency range, a first filter device configured to combine the input signal with a feedback signal, to filter the combined signal, and to output the filtered combined signal as a filtered signal, a quantizer configured to quantize the filtered signal and to output it as a quantized signal, wherein the feedback signal is generated based on the quantized signal and is fed back to the first filter device, an output interface configured to output the quantized signal as an output signal, and a second filter device configured to filter at least one of the input signal, the filtered signal, and the feedback signal in such a way that at least one frequency in the out-of-band frequency range of the input signal is amplified to suppress out-of-band quantization noise at the at least one frequency, wherein the input signal of the delta-sigma modulator is a digital signal and the output signal of the delta-sigma modulator is a digital bitstream; and a digital-analog converter configured to convert the output signal to an analog signal and to output the analog signal.

6. The delta-sigma digital-analog converter according to claim 5, wherein the delta-sigma digital-analog converter exhibits maximum suppression of quantization noise for at least one frequency in the in-band frequency range of the input signal and wherein the second filter device is configured to amplify at least one frequency in the out-of-band frequency range of the input signal which is a multiple of the at least one frequency in the in-band frequency range.

7. A method for operating a delta-sigma modulator, comprising the following steps:

receiving, by the delta-sigma modulator, an input signal, wherein the input signal includes frequency components in an in-band frequency range and frequency components in an out-of-band frequency range;

combining the input signal with a feedback signal and filtering the combined signal by the delta-sigma modulator;

quantizing the filtered signal, wherein the feedback signal is generated based on the quantized signal; and outputting the quantized signal as an output signal;

wherein at least one of the input signal, the filtered signal, and the feedback signal is filtered in such a way that at least one frequency in the out-of-band frequency range of the input signal is amplified to suppress out-of-band quantization noise at the at least one frequency.

8. The method according to claim 7, wherein the at least one frequency in the out-of-band frequency range of the input signal is amplified using a resonator.

9. A method for operating a delta-sigma digital-analog converter, the delta-sigma digital-analog converter including a delta-sigma modulator, the method comprising the following steps:

generating an output signal based on an input signal, by:
receiving, by the delta-sigma modulator, an input signal, wherein the input signal includes frequency components in an in-band frequency range and frequency components in an out-of-band frequency range, combining the input signal with a feedback signal and filtering the combined signal by the delta-sigma modulator, quantizing the filtered signal, wherein the feedback signal is generated based on the quantized signal, and outputting the quantized signal as an output signal, wherein at least one of the input signal, the filtered signal, and the feedback signal is filtered in such a way that at least one frequency in the out-of-band frequency range of the input signal is amplified to suppress out-of-band quantization noise at the at least one frequency, and wherein the input signal of the delta-sigma modulator is a digital signal and the output signal of the delta- sigma modulator is a digital bitstream; and converting the output signal to an analog signal and outputting the analog signal.

10. The method according to claim 9, wherein when operating the delta-sigma digital-analog converter for at least one frequency in the in-band frequency range of the input signal there occurs maximum suppression of quantization noise, and wherein at least one frequency in the out-of-band frequency range of the input signal which is a multiple of the at least one frequency in the in-band frequency range, is amplified.

\* \* \* \* \*